(12) United States Patent
Mizuno

(10) Patent No.: US 8,558,381 B2
(45) Date of Patent: Oct. 15, 2013

(54) SEMICONDUCTOR DEVICE

(75) Inventor: Yoshihito Mizuno, Nagoya (JP)

(73) Assignee: Toyota Jidosha Kabushiki Kaisha, Toyota-Shi ( * ) Notice: Subject to any disclaimer, the term of this patent is extended or adjusted under 35 U.S.C. 154(b) by 0 days.

(21) Appl. No.: 13/239,800

(22) Filed: Sep. 22, 2011

(65) Prior Publication Data
US 2012/0007241 A1 Jan. 12, 2012

Related U.S. Application Data

(63) Continuation of application No. PCT/JP2009/055624, filed on Mar. 23, 2009.

(51) Int. Cl.
*H01L 23/48* (2006.01)
(52) U.S. Cl.
USPC ........... 257/750; 257/741; 257/751; 257/756; 257/772; 257/779; 257/E21.584; 257/E23.16
(58) Field of Classification Search
USPC ........... 257/750, 751, E23.16, E21.584, 741, 257/756, 772, 779, E29.114
See application file for complete search history.

(56) References Cited

U.S. PATENT DOCUMENTS

| 3,922,385 | A | * | 11/1975 | Konantz et al. ............ 438/614 |
| 4,164,431 | A | | 8/1979 | Tang |
| 5,360,765 | A | | 11/1994 | Kondo et al. |
| 5,726,499 | A | | 3/1998 | Irinoda |
| 5,726,501 | A | | 3/1998 | Matsubara |
| 5,828,101 | A | | 10/1998 | Endo |
| 6,075,279 | A | * | 6/2000 | Andoh ........................ 257/620 |
| 6,117,771 | A | | 9/2000 | Murphy et al. |
| 6,309,965 | B1 | | 10/2001 | Matschitsch et al. |
| 6,514,804 | B1 | | 2/2003 | Yamaguchi |
| 6,731,494 | B2 | | 5/2004 | Nakamura |
| 7,679,185 | B2 | * | 3/2010 | Zimmerman et al. ........ 257/732 |
| 7,936,065 | B2 | | 5/2011 | Mizuno et al. |
| 2001/0015676 | A1 | | 8/2001 | Takikawa et al. |
| 2004/0035909 | A1 | | 2/2004 | Yeh et al. |
| 2004/0217474 | A1 | | 11/2004 | Kajiwara et al. |
| 2004/0237327 | A1 | | 12/2004 | Okabe et al. |

(Continued)

FOREIGN PATENT DOCUMENTS

| DE | 102007026365 A1 | 12/2007 |
| JP | 55-73868 A | 6/1980 |

(Continued)

OTHER PUBLICATIONS

Translation of Written Opinion of International Searching Authority for PCT/JP2009/055624 dated Jun. 23, 2009.

(Continued)

*Primary Examiner* — Jasmine Clark
(74) *Attorney, Agent, or Firm* — Kenyon & Kenyon LLP

(57) ABSTRACT

The present teachings provides a semiconductor device which has a semiconductor substrate, and a lower electrode including a first layer in contact with a lower surface of the semiconductor substrate, a second layer in contact with a lower surface of the first layer, and a third layer stacked at a position farther from the semiconductor substrate than the second layer, wherein the first layer is an aluminum layer containing silicon, the second layer is a layer including silicon as a primary component, and the third layer is a solder joint layer.

2 Claims, 3 Drawing Sheets

(56) References Cited

U.S. PATENT DOCUMENTS

| | | |
|---|---|---|
| 2005/0212076 A1 | 9/2005 | Schulze et al. |
| 2006/0049521 A1 | 3/2006 | Kayukawa et al. |
| 2006/0181828 A1 | 8/2006 | Sato et al. |
| 2006/0273351 A1 | 12/2006 | Ozoe et al. |
| 2007/0004098 A1 | 1/2007 | Kazama et al. |
| 2007/0173045 A1 | 7/2007 | Matsumura et al. |
| 2007/0296080 A1 | 12/2007 | Mizuno et al. |
| 2009/0206726 A1 | 8/2009 | Yamazaki et al. |
| 2011/0086471 A1 | 4/2011 | Kazama et al. |
| 2011/0121360 A1 | 5/2011 | Kazama et al. |

FOREIGN PATENT DOCUMENTS

| | | |
|---|---|---|
| JP | 4-72764 A | 3/1992 |
| JP | 5-136080 A | 6/1993 |
| JP | 08-153791 A | 6/1996 |
| JP | 8-264765 A | 10/1996 |
| JP | 10-163467 A | 6/1998 |
| JP | 2000-147658 A | 5/2000 |
| JP | 2001-36095 A | 2/2001 |
| JP | 2002-299623 A | 10/2002 |
| JP | 2002-343980 A | 11/2002 |
| JP | 2003-86787 A | 3/2003 |
| JP | 2006-324431 A | 11/2006 |
| JP | 2007-5368 A | 1/2007 |
| JP | 2007-19458 A | 1/2007 |
| JP | 2007-36211 A | 2/2007 |
| JP | 2007-335431 A | 12/2007 |
| JP | 2008-171890 A | 7/2008 |
| JP | 4221012 B1 | 11/2008 |

OTHER PUBLICATIONS

International Search Report mailed Jun. 23, 2009 of PCT/JP2009/055624.

\* cited by examiner

SEMICONDUCTOR DEVICE

CROSS-REFERENCE TO RELATED APPLICATION

This application is a continuation of PCT application PCT/JP2009/055624 filed on Mar. 23, 2009 designating the United States of America, the entire contents of which are incorporated by reference herein.

TECHNICAL FIELD

The present teachings relate to a vertical semiconductor device

DESCRIPTION OF RELATED ART

A lower electrode including a plurality of metallic layers is provided on a lower surface of a semiconductor device in order to connect and fix the semiconductor device to an external member such as a lead frame. The semiconductor device can be connected and fixed to the external member by soldering the lower electrode to the external member. The lower electrode is configured by stacking, e.g., an aluminum (Al) layer, a titanium (Ti) layer, a nickel (Ni) layer, a gold (Au) layer, and the like from a semiconductor substrate side. When the Al layer is formed directly on the lower surface of the semiconductor substrate, a heat treatment and the like during a solder reflow step causes interdiffusion between silicon (Si) of the semiconductor substrate and aluminum of the Al layer, resulting in an occurrence of aluminum spiking.

One method of suppressing the occurrence of the aluminum spiking involves arranging an alloy (Al—Si) layer of silicon and aluminum as a layer that comes into contact with the lower surface of the semiconductor substrate (hereinafter referred to as a first layer). However, even in this case, the aluminum spiking may occur in the solder reflow step.

In consideration thereof, e.g., patent document 1 discloses a technique for forming a titanium nitride layer between an Al—Si layer that is a first layer and a Ti layer stacked on a lower side of the Al—Si layer. Japanese Patent Application Publication No. 2008-171890 argues that an effect of suppressing occurrences of aluminum spiking is enhanced in the case of additionally forming a titanium nitride layer on a lower side of the first layer as compared to a case where an AL—Si layer is simply used as the first layer.

SUMMARY

Extensive research conducted by the present inventor has led to the following discoveries. That is, when the Al—Si layer is employed as the first layer that comes into contact with the lower surface of the semiconductor substrate, silicon contained in the first layer may diffuse in an opposite direction to the semiconductor substrate during the heat treatment in the solder reflow step. Due to this, a silicon segregation layer is created between the first layer and a layer stacked on a lower surface of the first layer. The silicon segregation layer is an alloy layer of a metallic material forming the first layer and a metallic material forming the layer stacked on the lower surface of the first layer. For example, when the first layer is the Al—Si layer and a Ti layer is formed in contact with the lower surface of the first layer, an alloy (Al—Si—Ti) layer including aluminum, silicon and titanium is created between the Al—Si layer and the Ti layer. As a result, a silicon concentration of the first layer decreases in a vicinity of a contact interface between the semiconductor substrate and the first layer, creating a same state as a case where an aluminum layer is used as the first layer. In other words, the aluminum spiking becomes more likely to occur.

The present teachings have been made in consideration of the above, and an object thereof is to suppress the occurrence of the aluminum spiking in the solder reflow step in the lower electrode of the semiconductor device when the aluminum layer containing silicon is used as the first layer provided in contact with the lower surface of the semiconductor substrate, by suppressing a decrease in the silicon concentration of the first layer in the vicinity of the contact interface between the semiconductor substrate and the first layer.

To this end, the present teachings provide a vertical semiconductor device comprising a semiconductor substrate and a lower electrode including a first layer in contact with a lower surface of the semiconductor substrate, a second layer in contact with a lower surface of the first layer, and a third layer stacked at a position farther from the semiconductor substrate than the second layer, wherein the first layer is an aluminum layer containing silicon, the second layer is a layer including silicon as a primary component, and the third layer is a solder joint layer.

In the present teachings, the second layer including silicon as the primary component is provided in contact with the lower surface of the first layer. The second layer supplies silicon to the first layer and isolates the first layer from an electrode layer (e.g., the third layer that is a solder joint layer) provided on the lower side of the first layer. Consequently, a decrease in a silicon concentration of the first layer in a vicinity of a contact interface between the semiconductor substrate and the first layer can be suppressed, and aluminum spiking can be suppressed from occurring in a solder reflow step.

The second layer and the third layer can either be provided in contact with each other or a separate electrode layer may be provided between the second layer and the third layer. For example, a barrier metallic layer such as a Ti layer may be provided between the second layer and the third layer.

A further separate electrode layer may be provided on a lower surface of the third layer. For example, when the third layer is a Ni layer, an Au layer or the like may be provided as a Ni antioxidation film on the lower side of the Ni layer.

An amorphous silicon layer or a polysilicon layer having a high silicon concentration and being readily formable in a manufacturing step can be suitably used as the second layer.

According to the present teachings, when the aluminum layer containing silicon is used as the first layer provided in contact with the lower surface of the semiconductor substrate in the lower electrode of the semiconductor device, the decrease in the silicon concentration of the first layer in the vicinity of the contact interface between the semiconductor substrate and the first layer can be suppressed. Consequently, the aluminum spiking can be suppressed from occurring in the solder reflow step.

DETAILED DESCRIPTION OF EMBODIMENT

Preferred aspects of below embodiments will be listed.
1. A titanium (Ti) layer is formed between a second layer and a third layer.
2. A gold (Au) layer is used as a nickel antioxidation layer.
3. An aluminum-silicon alloy (Al—Si) with a silicon concentration of 1 wt % is used as the first layer.

First Embodiment

Figures 1, 2:
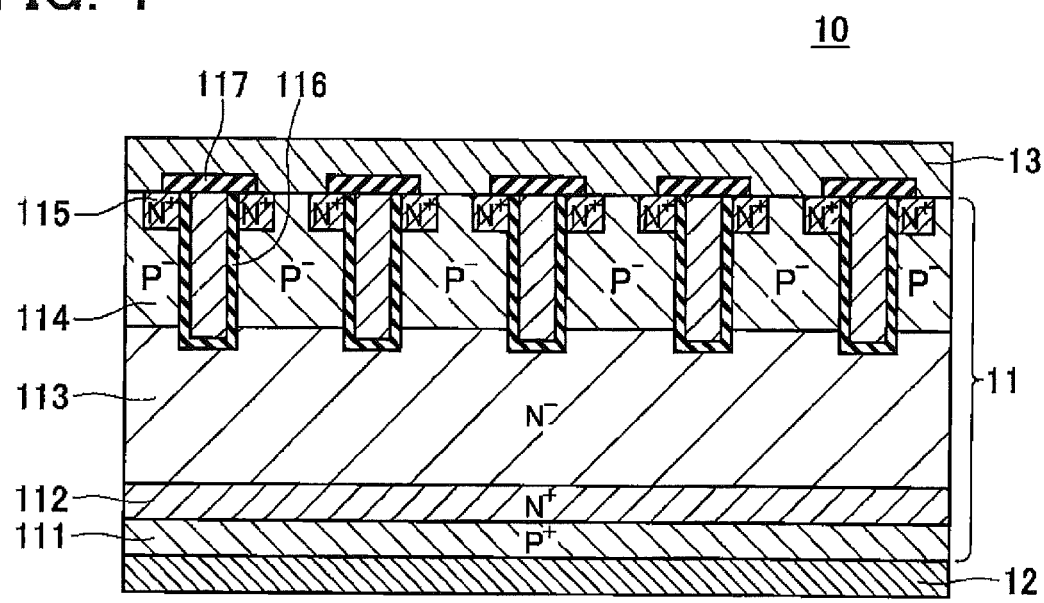
FIG. 1 is a cross-sectional view of a semiconductor device according to a first embodiment.
FIG. 2 is an enlarged view of a lower electrode of the semiconductor device according to the first embodiment.

An embodiment of the present teachings will now be described with reference to the drawings. As illustrated in FIG. 1, a semiconductor device 10 according to the present embodiment comprises a semiconductor substrate 11, a lower electrode 12, and an upper electrode 13. The semiconductor device 10 is connected and fixed to an external member such as a lead frame by soldering the lower electrode 12 thereof. The lower electrode 12 is provided on the entire lower surface of the semiconductor substrate 11.

A vertical insulated gate bipolar transistor (IGBT) such as that illustrated in FIG. 1 is built into the semiconductor substrate 11. As illustrated in FIG. 1, the semiconductor substrate 11 is formed by stacking, in order from the lower side thereof, a P⁺ collector region 111, an N⁺ buffer region 112, an N⁻ drift region 113, and a P⁻ body region 114. An N⁺ emitter region 115 is provided on an upper surface of the body region 114 (an upper surface of the semiconductor substrate 11). A trench gate 116 is provided so as to penetrate the body region 114 from the upper surface of the semiconductor substrate 11 and reach the drift region 113. The trench gate 116 comes into contact with the emitter region 115 on the upper side of the semiconductor substrate 11. The trench gate 116 is filled with a gate electrode covered by a gate insulator film, and an interlayer dielectric film 117 is provided on an upper surface of the gate electrode. The collector region 111 is electrically connected to the lower electrode 12. The emitter region 115 is electrically connected to the upper electrode 13.

FIG. 2 is an enlarged view of the lower electrode 12 illustrated in FIG. 1. The lower electrode 12 is formed by stacking, in order from the semiconductor substrate 11 side, an aluminum-silicon alloy (Al—Si) layer 121 as a first layer, a polysilicon layer 122 as a second layer, a titanium (Ti) layer 124 as a fourth layer, a nickel (Ni) layer 123 as a third layer, and a gold (Au) layer 125 as a fifth layer.

The Al—Si layer 121 is an example of a first layer including aluminum as a primary component, containing silicon, and is in contact with the lower surface (a collector region 111 side surface) of the semiconductor substrate 11. In the present embodiment, a silicon concentration of the Al—Si layer 121 is set to 1 wt %. As the first layer, an Al—Si alloy may be used as in the present embodiment or an Al—Si—Cu alloy in which copper (Cu) is added may be used. The silicon concentration of the first layer in a vicinity of a contact interface with the semiconductor substrate is only required to be 0.25 wt % or higher and favorably 0.5 wt % or higher. Around 100 to 2000 nm is sufficient as a thickness of the first layer. While a sputtering method is generally used as a film formation method for the first layer, a vapor deposition method, a plating method, or a Chemical Vapor Deposition (CVD) method can also be used.

The polysilicon layer 122 is an example of the second layer including silicon as a primary component, and is in contact with a lower surface of the Al—Si layer 121 (first layer). A polysilicon layer or an amorphous silicon layer that is readily formable in a manufacturing step can be favorably used as the second layer, but the present embodiment is not limited thereto. In the present embodiment, the polysilicon layer 122 is also in contact with the Ti layer 124 (fourth layer). In this case, the polysilicon layer 122 desirably contains a high concentration of N-type impurities for the purpose of making electrical contact with the Ti layer 124. The N-type impurities favorably have a concentration that enables ohmic contact with the Ti layer 124 and can be set to a concentration of, e.g., $1.0 \times 10^{15}$ cm$^{-3}$ or higher. While a sputtering method is generally used as a film formation method for the second layer, a vapor deposition method or a CVD method can also be used.

A film thickness of the second layer is adjusted according to conditions (e.g., a heat treatment temperature) of the solder reflow step. When the solder reflow step is performed at a reflow temperature of around 350 to 400° C., the aluminum spiking can be sufficiently suppressed from occurring if the second layer has a thickness of 50 nm or more.

The Ti layer 124 is an example of the fourth layer that is a solder diffusion preventing layer (barrier layer), and is in contact with a lower surface of the polysilicon layer 122 (second layer). In addition to Ti that is used in the present embodiment, Mo, Zr, Hf, V, Nb, Ta, Cr, W, Co, and the like may be favorably used as the fourth layer. Around 50 to 500 nm is sufficient as a thickness of the fourth layer. While the sputtering method is generally used as a film formation method for the fourth layer, the vapor deposition method or the CVD method can also be used. Moreover, the fourth layer is not an essential constituent of the lower electrode according to the embodiment of the present teachings and need not necessarily be provided. In this case, the third layer is provided in contact with the lower surface of the second layer.

The Ni layer 123 is an example of the third layer that is a solder joint layer, and is in contact with a lower surface of the Ti layer 124 (fourth layer). A material capable of forming a eutectic with a solder can be used as the third layer. In addition to Ni that is used in the present embodiment, Cu and the like can be favorably used as the third layer. Around 100 to 2000 nm is sufficient as a thickness of the third layer. While the sputtering method is generally used as a film formation method for the third layer, a vapor deposition method, a plating method, or a CVD method can also be used.

The Au layer 125 is an example of the fifth layer that is an antioxidation layer of the third layer, and is in contact with a lower surface of the Ni layer 123 (third layer). A material capable of preventing surface oxidation of the third layer and securing solder wettability can be used as the fifth layer. Au, Ag, and the like can be favorably used as the fifth layer. Around 10 to 500 nm is sufficient as a thickness of the fifth layer. While a sputtering method is generally used as a film formation method for the fifth layer, a vapor deposition method, a plating method, or a CVD method can also be used. Moreover, the fifth layer is not an essential constituent of the lower electrode according to the embodiment of the present teachings and need not necessarily be provided.

The semiconductor device 10 is electrically connected to the external member by the solder reflow step. Due to heat treatment performed in the solder reflow step, an alloy is formed by a part of the Ni layer 123 (the third layer that is a solder joint layer) included in the lower electrode 12 of the semiconductor device 10 and a part of the solder. Consequently, the lower electrode 12 of the semiconductor device 10 and the external member are connected to each other via the solder.

Figure 5:
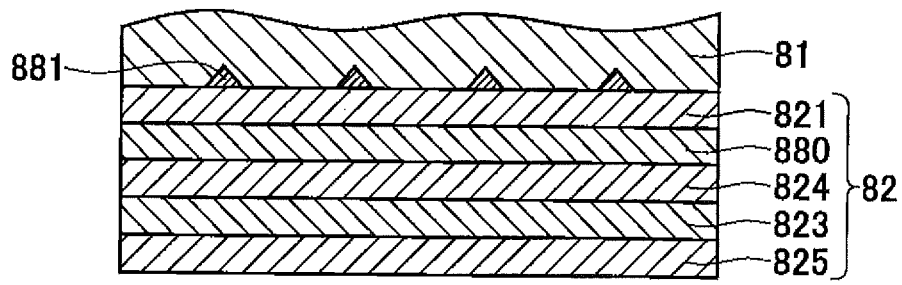
FIG. 5 is a diagram explaining a state of a lower electrode of a conventional semiconductor device after a solder reflow step.

FIG. 5 is a diagram illustrating a state after a solder reflow step of a conventional lower electrode 82 that does not include a polysilicon layer (second layer). In the conventional lower electrode 82 (prior to the solder reflow step), a Ti layer 824 is provided in contact with a lower surface of an Al—Si layer 821, and a Ni layer 823 and a Au layer 825 are further stacked on a lower surface of the Ti layer 824. In a case of the semiconductor device using the conventional lower electrode 82, depending on conditions (e.g., a temperature condition) of the heat treatment performed in the solder reflow step, silicon contained in the Al—Si layer 821 diffuses to the Ti layer 824 side after the solder reflow step and creates an alloy (Al—Si—Ti) layer 880 of aluminum, silicon, and titanium between the Al—Si layer 821 and the Ti layer 824 as illustrated in FIG. 5. As a result, silicon concentration of the Al—Si layer 821 decreases in the vicinity of the contact interface between the semiconductor substrate 81 and the Al—Si layer 821. Consequently, the silicon in the semiconductor substrate 81 diffuses into the Al—Si layer 821 and the aluminum in the Al—Si layer 821 protrudingly penetrates into the semiconductor substrate 81 side to cause aluminum spiking 881.

As illustrated in FIG. 2, the lower electrode 12 according to the present embodiment is formed by stacking, from the semiconductor substrate side, the Al—Si layer 121, the polysilicon layer 122, the Ti layer 124, the Ni layer 123, and the Au layer 125. The polysilicon layer 122 supplies silicon to the Al—Si layer 121 and, at the same time, isolates the Al—Si layer 121 from the Ti layer 124. Since silicon is supplied from the polysilicon layer 122 to the Al—Si layer 121, the decrease in the silicon concentration of the Al—Si layer 121 in the solder reflow step can be suppressed. In addition, since the Al—Si layer 121 and the Ti layer 124 are isolated from each other by the polysilicon layer 122, the formation during the solder reflow step of an alloy by Al and Si contained in the Al—Si layer 121 and Ti contained in the Ti layer 124 can be suppressed. More specifically, an Al—Si—Ti layer is prevented from being created on a lower surface (a surface opposite to the semiconductor substrate 11 side) of the Al—Si layer 121, thereby enabling the decrease in the silicon concentration of the Al—Si layer 121 to be suppressed. As described above, according to the present embodiment, the decrease in silicon concentration of the Al—Si layer 121 in the vicinity of the contact interface between the semiconductor substrate 11 and the Al—Si layer 121 can be suppressed due to the polysilicon layer 122. Consequently, the occurrence of aluminum spiking can be effectively suppressed.

While the lower electrode is provided so as to cover the entire lower surface of the semiconductor substrate in the above description, the lower electrode may alternatively be provided at a part of the lower surface of the semiconductor substrate. For example, as in a case of a semiconductor device 30 illustrated in FIG. 3, the lower electrode 12 according to the first embodiment may only be provided on a lower surface of an active region (effective region) 311 of a semiconductor substrate 31, and the conventional lower electrode 82 that does not include a second layer (polysilicon layer) may be provided on a lower surface of an inactive region (ineffective region) 312 that does not contribute to electrical conduction.

Figure 3:
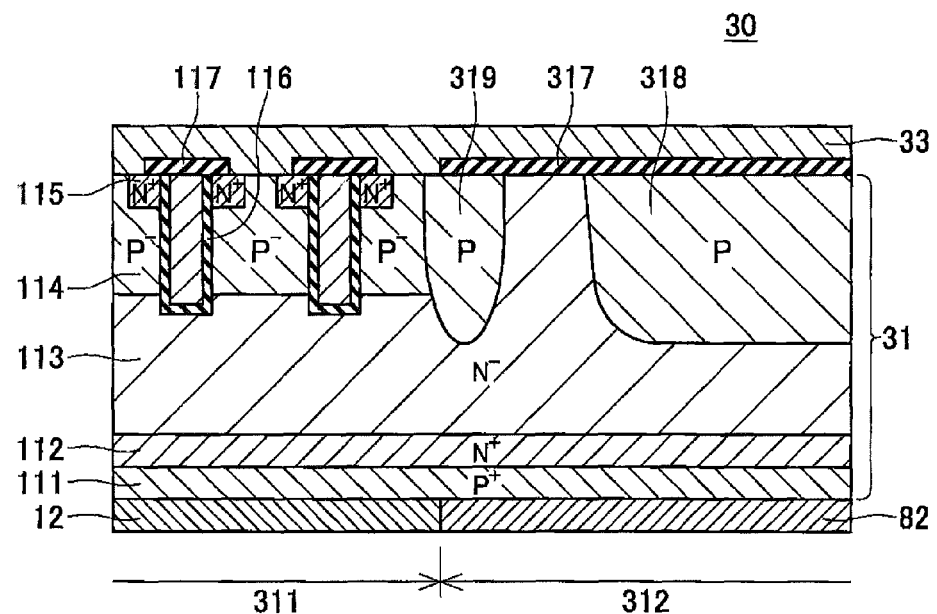
FIG. 3 is a cross-sectional view of a semiconductor device according to a modified example.

As illustrated in FIG. 3, for example, only P-type diffusion regions 318 and 319 are formed on an upper side of the semiconductor substrate 31 in the inactive region 312, and an interlayer dielectric film 317 is provided on a surface of the P-type diffusion regions 318 and 319. Since an IGBT similar to that in the first embodiment is built into the active region 311, an overlapping description of the active region 311 will be omitted. An upper electrode 33 is provided on an upper surface of the semiconductor substrate 31.

Figure 4:
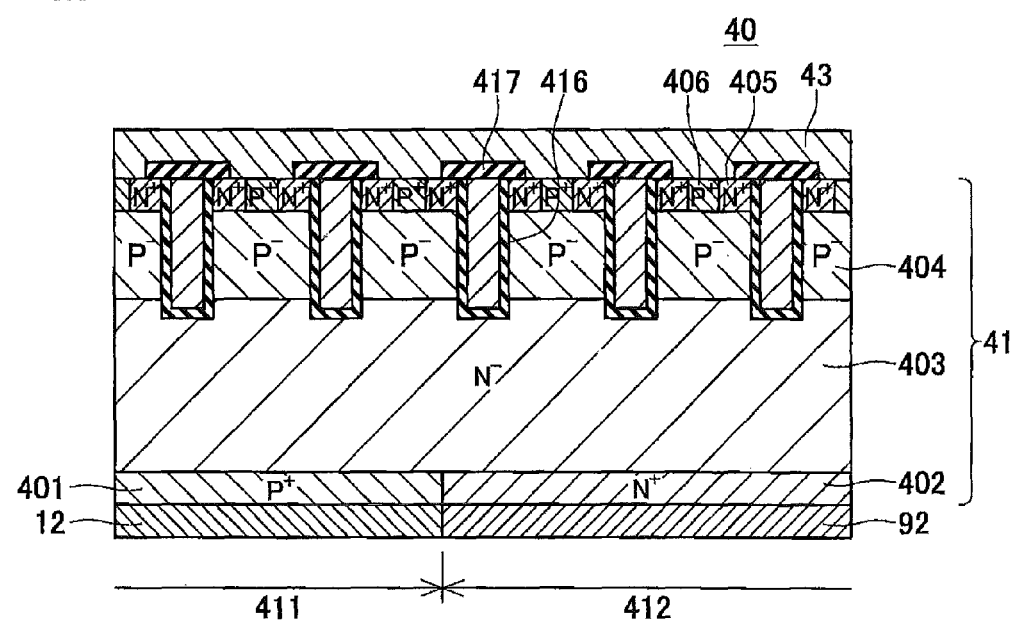
FIG. 4 is a cross-sectional view of a semiconductor device according to a modified example.

In addition, as illustrated in FIG. 4, in a semiconductor device 40 in which an IGBT region 411 and a diode region 412 are integrally formed on a single semiconductor substrate 41, the lower electrode 12 according to the first embodiment may only be provided on a lower surface of the IGBT region 411 and an lower electrode 92 that does not include a first layer (Al—Si layer) and a second layer (polysilicon layer) may be provided on a lower surface of the diode region 412.

In other words, the semiconductor substrate 41 comprises the IGBT region 411 whose lower side is a P$^+$ layer 401 and the diode region 412 whose lower side is an N$^+$ layer 402. The configurations of upper sides of the P$^+$ layer 401 and the N$^+$ layer 402 are the same for the IGBT region 411 and the diode region 412, and an N$^-$ layer 403 and a P$^-$ layer 404 are sequentially stacked on the P$^+$ layer 401 and the N$^+$ layer 402. An N$^+$ layer 405 and a P$^+$ layer 406 are provided on an upper surface of the P$^-$ layer 404. A trench gate 416 is provided so as to penetrate the P$^-$ layer 404 from an upper surface of the semiconductor substrate 41 and reach the N$^-$ layer 403. The trench gate 416 is in contact with the N$^+$ layer 405. The trench gate 416 is filled with a gate electrode covered by a gate insulator film, and an interlayer dielectric film 417 is provided on a upper surface of the gate electrode. The lower electrode 12 is provided on a lower surface of the P$^+$ layer 401 and the lower electrode 92 is provided on a lower surface of the N$^+$ layer 402. The N$^+$ layer 405 and the P$^+$ layer 406 are electrically connected to an upper electrode 43.

As illustrated in FIG. 4, in the diode region 412, since the semiconductor substrate 41 has an N-type lower surface, a Ti layer can be used as an electrode layer in contact with the semiconductor substrate 41. Since the lower electrode 92 that does not have the first layer and the second layer can be used in the diode region 412, manufacturing cost can be reduced.

Although an embodiment of the present teachings has been described using specific terms, such a description is for illustrative purposes only and is not intended to limit the scope of the following claims. The technology described in the claims is to include various modifications and changes made to the specific examples illustrated above.

The technological components illustrated in the present description and the accompanying drawings are designed such that the technical utility thereof is to be exercised either singularly or in combination, and are not limited to the combinations described in the claims upon application. In addition, the technology exemplified in the present description and the accompanying drawings are capable of simultaneously achieving a plurality of objects, whereby achieving one of such objects offers technical utility.

What is claimed is:

1. A vertical semiconductor device comprising:
    a semiconductor substrate; and
    a lower electrode including a first layer in contact with a lower surface of the semiconductor substrate, a second layer in contact with a lower surface of the first layer, and a third layer stacked at a position farther from the semiconductor substrate than the second layer, wherein:
    the first layer is an aluminum layer containing silicon;
    the second layer is a layer including silicon; and
    the third layer is a solder joint layer.

2. The vertical semiconductor device according to claim 1, wherein the second layer is an amorphous silicon layer or a polysilicon layer.

* * * * *